US012713710B2

(12) United States Patent
Chang et al.

(10) Patent No.: US 12,713,710 B2
(45) Date of Patent: Aug. 18, 2026

(54) ESD PROTECTION CIRCUIT AND STRUCTURE

(71) Applicant: Vanguard International Semiconductor Corporation, Hsinchu (TW)

(72) Inventors: Ting-Yu Chang, Zhubei City (TW); Jian-Hsing Lee, Hsinchu City (TW); Yeh-Ning Jou, Hsinchu City (TW); Chih-Hsuan Lin, Hsinchu City (TW); Chieh-Yao Chuang, Kaohsiung City (TW); Hsien-Feng Liao, Taichung City (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 343 days.

(21) Appl. No.: 18/640,486

(22) Filed: Apr. 19, 2024

(65) Prior Publication Data

US 2025/0331309 A1 Oct. 23, 2025

(51) Int. Cl.
*H10D 89/60* (2025.01)
*H03K 17/0812* (2006.01)

(52) U.S. Cl.
CPC ..... *H10D 89/713* (2025.01); *H03K 17/08126* (2013.01); *H10D 89/611* (2025.01)

(58) Field of Classification Search
CPC .......................... H10D 89/713; H10D 89/611
USPC ........................................................ 257/173
See application file for complete search history.

(56) References Cited

U.S. PATENT DOCUMENTS

2019/0378833 A1* 12/2019 Choi .................... H10D 10/061

* cited by examiner

*Primary Examiner* — Amir Shahnami
(74) *Attorney, Agent, or Firm* — Birch, Stewart, Kolasch & Birch, LLP

(57) ABSTRACT

An ESD protection circuit is provided. A first PNP BJT is coupled to a first power pad and a second power pad. A first resistor is coupled between the first power pad and the base of the first PNP BJT. The emitter of a second PNP BJT is coupled to the second power pad. The collector of the second PNP BJT is coupled to a third power pad. The cathode of a diode is coupled to the first power pad and the base of the second PNP BJT. The anode of the diode is coupled to the third power pad. A specific BJT is coupled between the first and second power pads. A second resistor is coupled between the emitter and the base of the specific BJT. In response to an ESD event occurring, the first PNP BJT and the specific BJT are turned.

20 Claims, 14 Drawing Sheets

ESD PROTECTION CIRCUIT AND STRUCTURE

BACKGROUND OF THE INVENTION

Field of the Invention

The present invention relates to an electrostatic discharge (ESD) protection circuit, and, in particular, to an ESD protection circuit comprising PNP bipolar junction transistors.

Description of the Related Art

As the semiconductor manufacturing process has developed, electrostatic discharge (ESD) protection has become one of the most critical reliability issues for integrated circuits (IC). In particular, as semiconductor processing advances into the deep sub-micron stage, scaled-down devices and thinner gate oxides are more vulnerable to ESD stress. Generally, the input/output pads on IC chips must sustain at least 2 kVolt of ESD stress of high Human Body Mode (HBM) or 200V of Machine Mode (MM).

BRIEF SUMMARY OF THE INVENTION

In accordance with an embodiment of the disclosure, an electrostatic discharge (ESD) protection circuit protects a core circuit and comprises a first PNP bipolar junction transistor (BJT), a first resistor, a second PNP BJT, a diode, a specific BJT, and a second resistor. The first PNP BJT comprises a first base, a first emitter, and a first collector. The first emitter is coupled to a first power pad. The first collector is coupled to a second power pad. The first resistor is coupled between the first power pad and the first base. The second PNP BJT comprises a second base, a second emitter, and a second collector. The second emitter is coupled to the second power pad. The second collector is coupled to a third power pad. The cathode of the diode is coupled to the first power pad and the second base. The anode of the diode is coupled to the third power pad. The specific BJT is coupled between the first and second power pads. The second resistor is coupled between the emitter and the base of the specific BJT. In response to an ESD event occurring, the first PNP BJT and the specific BJT are turned on so that an ESD current passes through the first PNP BJT and the specific BJT.

In accordance with another embodiment of the disclosure, an ESD protection structure comprises a P-type substrate, a deep N-type well, a first well, a first P-type doped region, a second well, a second P-type doped region, a third well, a third P-type doped region, a fourth well, a fourth P-type doped region, a fifth well, a specific doped region, and a N-type doped region. The deep N-type well is formed in the P-type substrate. The first well is formed on the deep N-type well. The first P-type doped region is formed in the first well. The second well is formed on the deep N-type well. The second P-type doped region is formed in the second well. The third well is formed on the deep N-type well. The third P-type doped region is formed in the third well. The fourth well is formed on the deep N-type well. The fourth P-type doped region is formed in the fourth well. The fifth well is formed on the deep N-type well. The specific doped region is formed in the fourth or fifth well. The N-type doped region is formed in the fifth well. The conductivity types of the first, third, and fourth wells are P-type. The conductivity types of the second and fifth wells are N-type.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
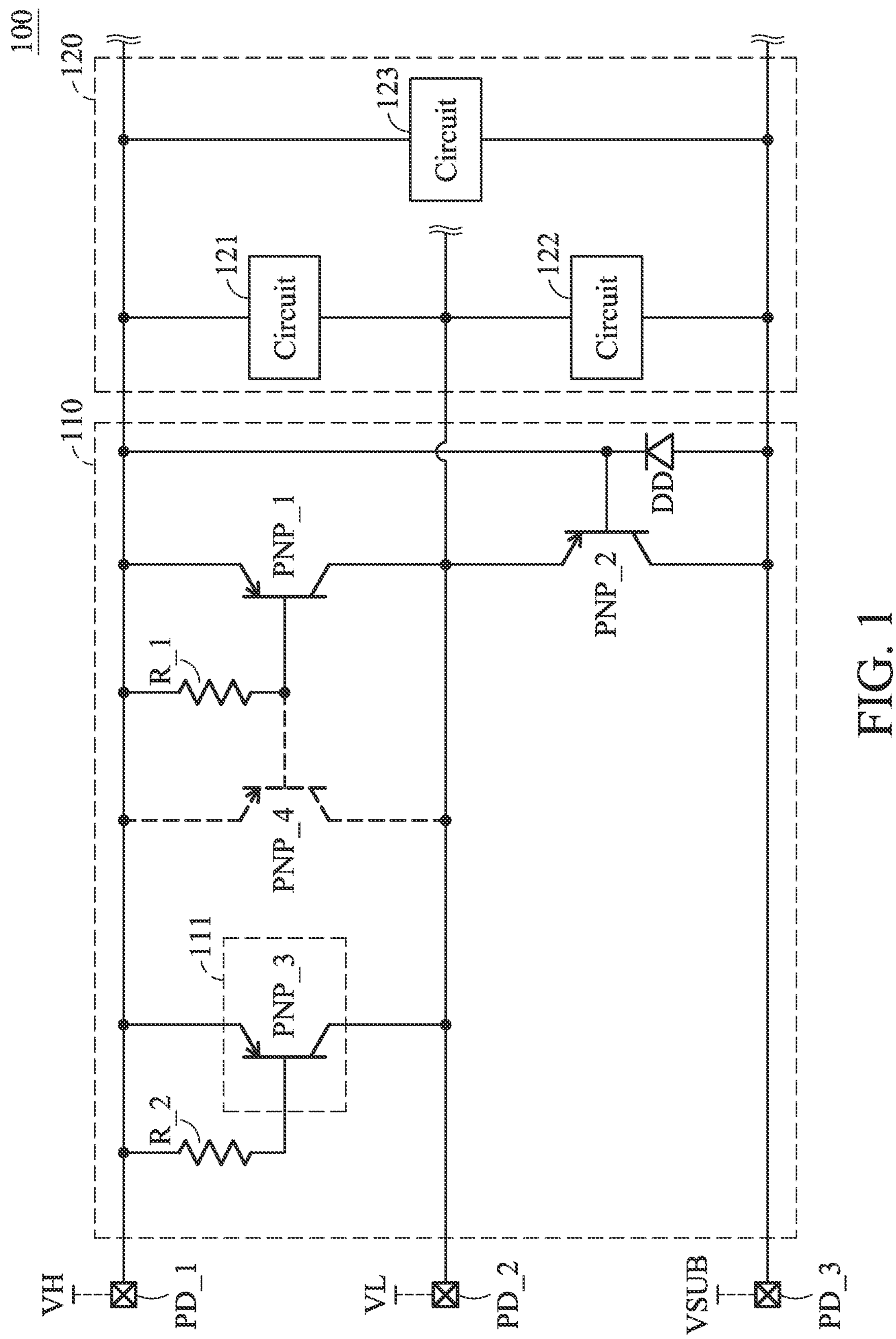
FIG. 1 is a schematic diagram of an exemplary embodiment of an operating system according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operating system according to various aspects of the present disclosure. As shown in FIG. 1, the operating system 100 comprises an electrostatic discharge (ESD) protection circuit 110 and a core circuit 120. The ESD protection circuit 110 and the core circuit 120 are coupled to the power pads PD_1~PD_3. In this embodiment, the ESD protection circuit 110 is configured to protect the core circuit

120 to avoid the current from one of the power pads PD_1~PD_3 from entering and damaging the core circuit 120.

In one embodiment, the core circuit 120 comprises circuits 121~123. The circuit 121 is coupled between the power pads PD_1 and PD_2. The circuit 122 is coupled between the power pads PD_2 and PD_3. The circuit 123 is coupled between the power pads PD_1 and PD_3. The number of circuits in the core circuit 120 is not limited in the present disclosure. In one embodiment, the core circuit 120 comprises more or fewer circuits. Each circuit is coupled to at least two power pads.

When there is no an ESD event, the operating system 100 operates in a normal mode. In the normal mode, the ESD protection circuit 110 does not work. At this time, the power pad PD_1 may receive an operation voltage VH, the power pad PD_2 may receive an operation voltage VL, and the power pad PD_3 may receive an operation voltage VSUB. The circuit 121 works according to the operation voltages VH and VL. The circuit 122 works according to the operation voltages VL and VSUB. The circuit 123 works according to the operation voltages VH and VSUB. In one embodiment, the operation voltage VH is higher than the operation voltage VL, and the operation voltage VL is higher than the operation voltage VSUB.

When an ESD event occurs, the operating system 100 operates in a protection mode. In the protection mode, the ESD protection circuit 110 releases the ESD current from one of the power pads PD_1~PD_3 to avoid the current from entering the core circuit 120. For example, when an ESD event occurs at the power pad PD_1 and the power pads PD_2 and PD_3 are coupled to ground, the ESD protection circuit 110 provides a turned-on path so that the ESD current from the power pad PD_1 passes through the ESD protection circuit 110 and enters the power pads PD_2 and PD_3.

In this embodiment, the ESD protection circuit 110 comprises PNP bipolar junction transistors (BJTs) PNP_1 and PNP_2, resistors R_1 and R_2, a diode DD, and a specific BJT 111. In some embodiment, the PNP BJTs PNP_1 and PNP_2, the resistors R_1 and R_2, the diode DD, and the specific BJT 111 share the same substrate.

The emitter of the PNP BJT PNP_1 is coupled to the power pad PD_1. The collector of the PNP BJT PNP_1 is coupled to the power pad PD_2. The resistor R_1 is coupled between the power pad PD_1 and the base of the PNP BJT PNP_1.

The emitter of the PNP BJT PNP_2 is coupled to the power pad PD_2. The collector of the PNP BJT PNP_2 is coupled to the power pad PD_3. The base of the PNP BJT PNP_2 is coupled to the power pad PD_1. The cathode of the diode DD is coupled to the power pad PD_1. The anode of the diode DD is coupled to the power pad PD_3.

The specific BJT 111 is coupled between the power pads PD_1 and PD2. In this embodiment, the specific BJT 111 is a PNP BJT PNP_3. In this case, the emitter of the PNP BJT PNP_3 is coupled to the power pad PD_1. The collector of the PNP BJT PNP_3 is coupled to the power pad PD_2. The resistor R_2 is coupled between the emitter and the base of the PNP BJT PNP_3.

When an ESD event occurs in the power pad PD_1 and the power pads PD_2 and PD_3 are coupled to ground, since the parasitic diode between the base and the collector of the PNP BJT PNP_1 and the parasitic diode between the base and the collector of the PNP BJT PNP_3 are reverse biased, the parasitic diodes of the PNP BJTs PNP_1 and PNP_3 are turned on. Therefore, the PNP BJTs PNP_1 and PNP_3 are turned on so that the ESD current from the power pad PD_1 passes through the PNP BJTs PNP_1 and PNP_3 and enters the power pads PD_2 and PD_3.

In some embodiments, when the PNP BJT PNP_1 is turned on, the resistance between the emitter and the collector of the PNP BJT PNP_1 is referred to as a first on-resistance. Similarly, when the PNP BJT PNP_3 is turned on, the resistance between the emitter and the collector of the PNP BJT PNP_3 is referred to as a second on-resistance. Since the first on-resistance is connected to the second on-resistance in parallel, the on-resistance of the ESD protection circuit 110 is reduced. Therefore, the ESD current enters the ESD protection circuit 110 to ensure that the core circuit 120 is not damaged by the ESD current.

In other embodiments, the ESD protection circuit 110 further comprises a parasitic PNP BJT PNP_4. The parasitic PNP BJT PNP_4 and the PNP BJT PNP_1 share the same substrate. The base of the parasitic PNP BJT PNP_4 is coupled to the base of the PNP BJT PNP_1. The emitter of the parasitic PNP BJT PNP_4 is coupled to the power pad PD_1. The collector of the parasitic PNP BJT PNP_4 is coupled to the power pad PD_2.

When an ESD event occurs, since the parasitic diode between the base and the collector of the parasitic PNP BJT PNP_4 is reverse biased. Therefore, the ESD current passes through the parasitic PNP BJT PNP_4, and the PNP BJTs PNP_1 and PNP_3. At this time, the resistance between the emitter and the collector of the parasitic PNP BJT PNP_4 is referred to as a third on-resistance. Since the first, second and third on-resistances are connected to in parallel with each other, the overall on-resistance of the ESD protection circuit 110 can be greatly reduced and ensure that the ESD current does not enter the core circuit 120.

Figure 2:
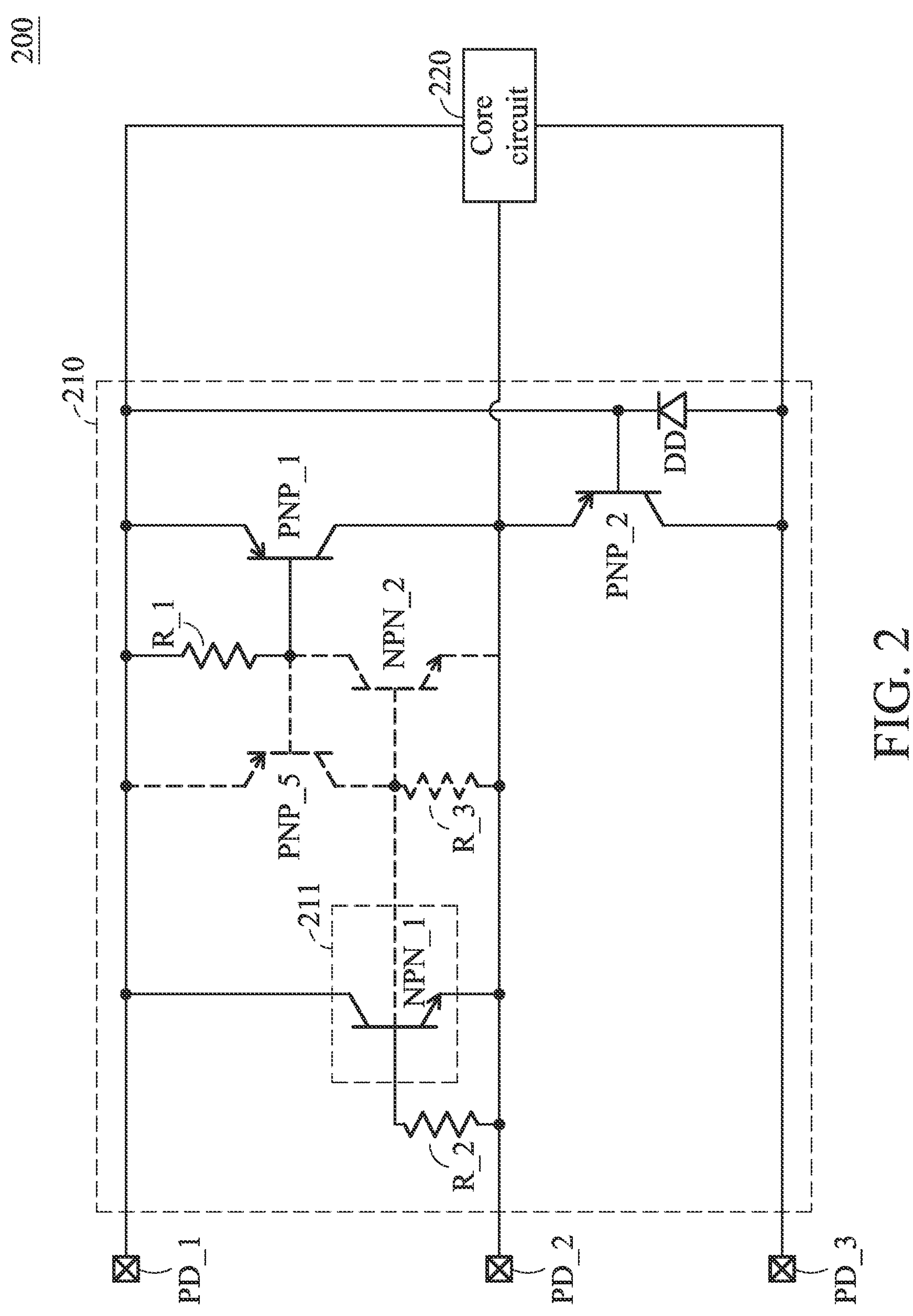
FIG. 2 is a schematic diagram of another exemplary embodiment of the operating system according to various aspects of the present disclosure.

FIG. 2 is a schematic diagram of another exemplary embodiment of the operating system according to various aspects of the present disclosure. The operating system 200 comprises an ESD protection circuit 210 and a core circuit 220. The ESD protection circuit 210 and the core circuit 220 are coupled to the power pads PD_1~PD_3. In this embodiment, the ESD protection circuit 210 protects the core circuit 220 to prevent the ESD current from the power pads PD_1~PD_3 from entering the core circuit 220. Since the feature of core circuit 220 is similar to the feature of core circuit 120, the description of core circuit 220 is omitted.

The ESD protection circuit 210 comprises the PNP BJTs PNP_1 and PNP_2, the resistors R_1 and R_2, the diode DD, and a specific BJT 211. Since the characteristics of the PNP BJTs PNP_1 and PNP_2, the resistors R_1 and R_2, and the diode DD have been described above, the descriptions of the PNP BJTs PNP_1 and PNP_2, the resistors R_1 and R_2, and the diode DD are omitted.

In this embodiment, the specific BJT 211 is a NPN BJT NPN_1. The collector of the NPN BJT NPN_1 is coupled to the power pad PD_1. The emitter of the NPN BJT NPN_1 is coupled to the power pad PD_2. The resistor R_2 is coupled between the base and the emitter of the NPN BJT NPN_1. In some embodiments, the NPN BJT NPN_1 and the PNP BJT PNP_1 share the same substrate.

In some embodiments, the ESD protection circuit 210 further comprises a parasitic PNP BJT PNP_5, a parasitic NPN BJT NPN_2, and a parasitic resistor R_3. The base of the parasitic PNP BJT PNP_5 is coupled to the base of the PNP BJT PNP_1. The emitter of the parasitic PNP BJT PNP_5 is coupled to the power pad PD_1. The collector of the parasitic PNP BJT PNP_5 is coupled to the base of the parasitic NPN BJT NPN_1. The parasitic resistor R_3 is coupled between the collector of the parasitic PNP BJT PNP_5 and the power pad PD_2.

The base of the parasitic NPN BJT NPN_2 is coupled to the base of the NPN BJT NPN_1. The emitter of the parasitic NPN BJT NPN_2 is coupled to the power pad PD_2. The collector of the parasitic NPN BJT NPN_2 is coupled to the base of the PNP BJT PNP_1. In this embodiment, the parasitic PNP BJT PNP_5 and the parasitic NPN BJT NPN_2 form a silicon controlled rectifier (SCR). In some embodiments, the parasitic PNP BJT PNP_5, the parasitic NPN BJT NPN_2, the PNP BJT PNP_1, and the NPN BJT NPN_11 share the same substrate.

When an ESD event occurs in the power pad PD_1 and the power pads PD_2 and PD_3 are coupled to ground, the first parasitic diode between the base and the collector of the PNP BJT PNP_1, the second parasitic diode between the base and the collector of the NPN BJT NPN_1, the third parasitic diode between the base and the collector of the parasitic PNP BJT PNP_5 are reverse biased. Therefore, the PNP BJT PNP_1, the NPN BJT NPN_1, the parasitic PNP BJT PNP_5, and the parasitic NPN BJT NPN_2 are turned on. An ESD current from the power pad PD_1 is released to ground.

Figure 3A:
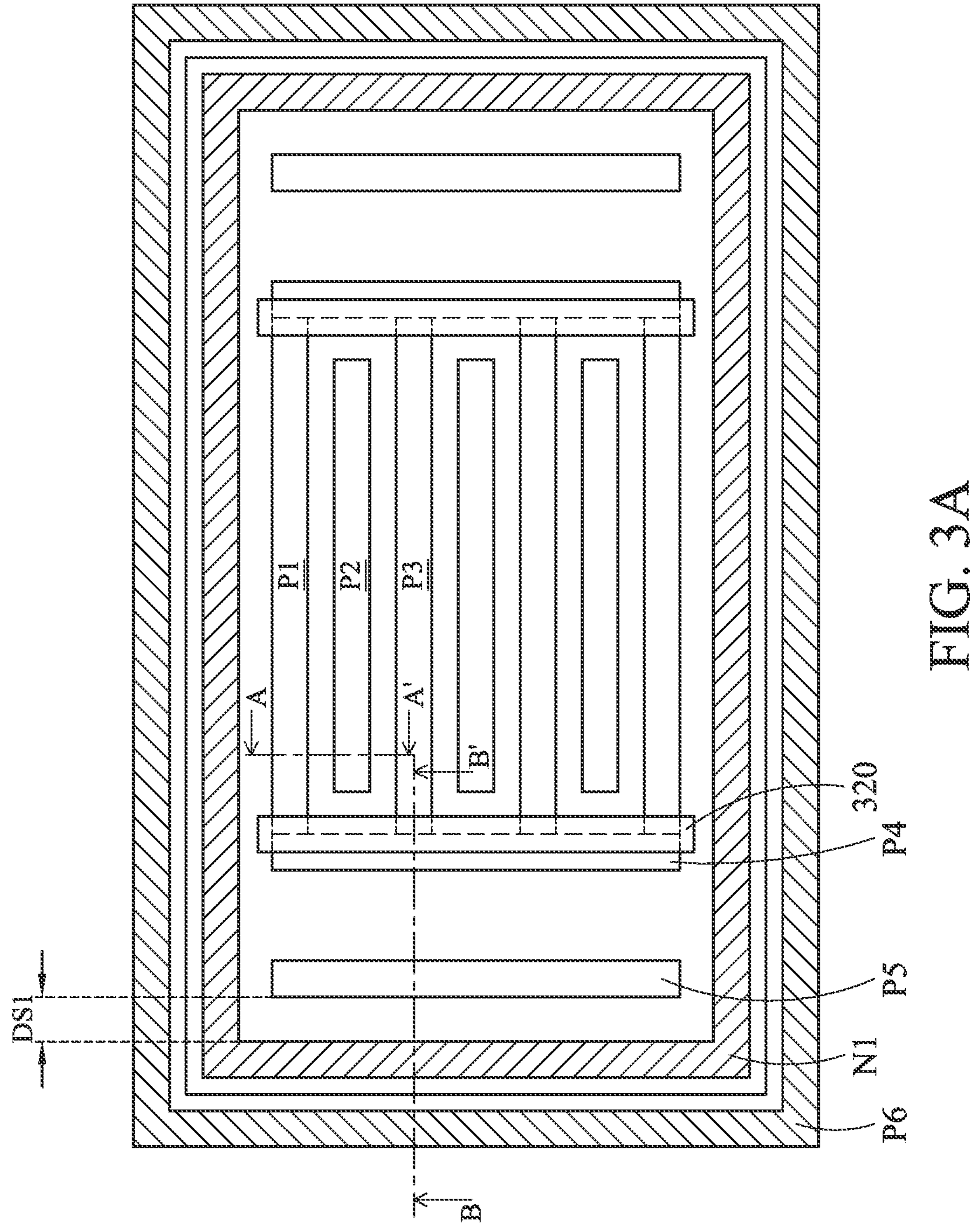
FIG. 3A is a top view of an exemplary embodiment of an ESD protection structure according to various aspects of the present disclosure.
Figure 4A:
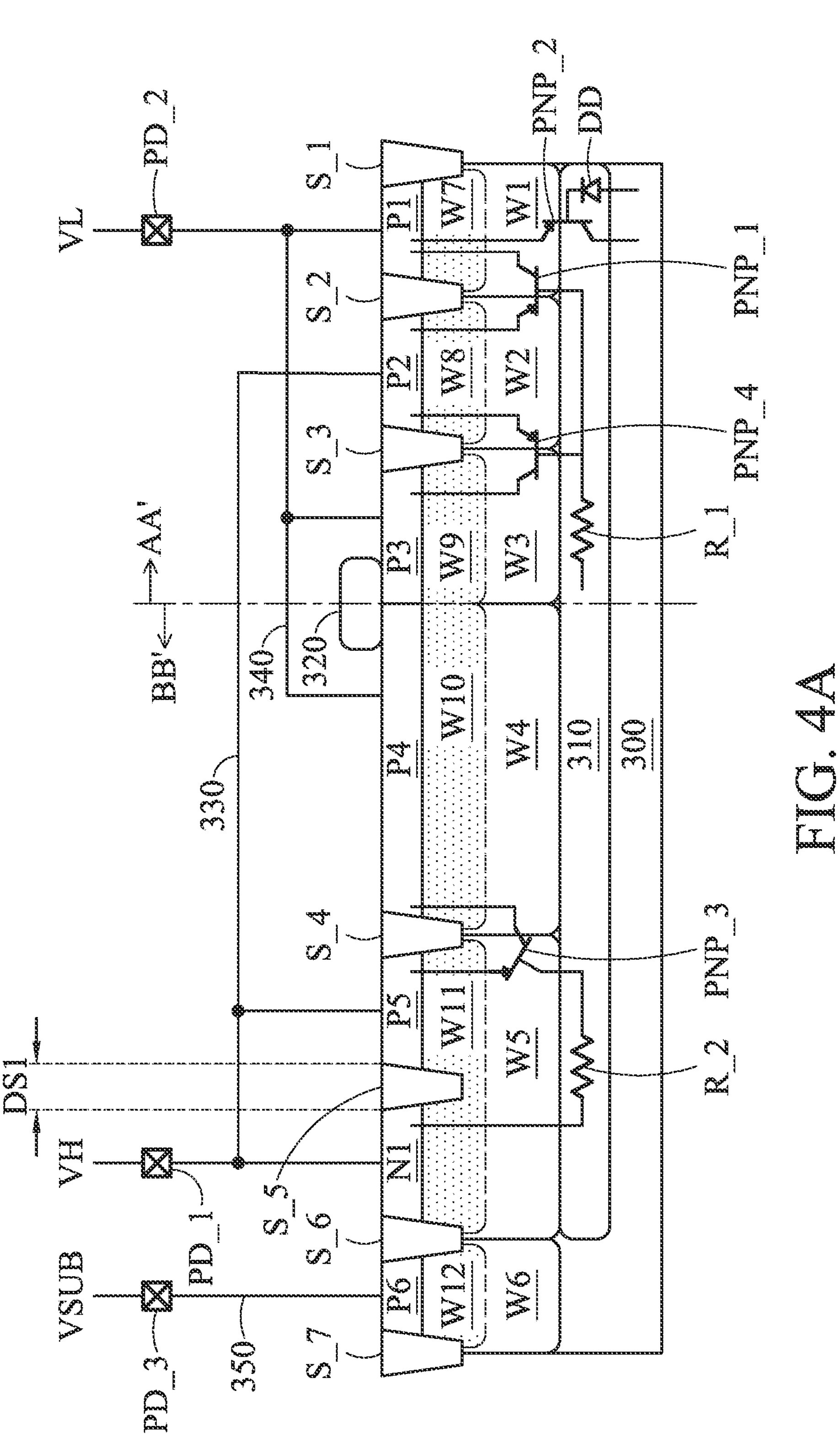
FIG. 4A is a cross-sectional view of the ESD protection structure along the dotted lines AA' and BB' in FIG. 3A.

FIG. 3A is a top view of an exemplary embodiment of an ESD protection structure according to various aspects of the present disclosure. FIG. 4A is a cross-sectional view of the ESD protection structure in FIG. 3A along the dotted lines AA' and BB'. As shown in FIG. 4A, the ESD protection structure 400A comprises a P-type substrate 300, a deep N-type well (DNW) 310, wells W1~W5, and doped regions P1~P5 and N1. The deep N-type well 310 is formed in the P-type substrate 300. The wells W1~W5 are formed on the deep N-type well 310. In this embodiment, the conductivity types of the wells W1, W3, and W4 are P-type, and the conductivity types of the wells W2 and W5 are N-type. In this case, the impurity concentration of the well W1 is similar to the impurity concentration of each of the well W3 and W4, and is higher than the impurity concentration of the P-type substrate 300. The impurity concentration of the well W2 is similar to the impurity concentration of the well W5 and is higher than the impurity concentration of the deep N-type well 310.

The doped region P1 is formed in the well W1. The doped region P2 is formed in the well W2. The doped region P3 is formed in the well W3. The doped region P4 is formed in the well W4. The doped region P5 is formed in the well W5. In this embodiment, the conductivity types of the doped regions P1~P5 are P-type. The impurity concentrations in the doped regions P1~P5 are similar and higher than the impurity concentration of the well W1. The doped region N1 is formed in the well W5. In this embodiment, the conductivity type of the doped region N1 is N-type. The impurity concentration of the doped region N1 is higher than the impurity concentration of the well W5.

In other embodiments, the ESD protection structure 400A further comprises a well W6 and a doped region P6. The well W6 is formed in the P-type substrate 300. The doped region P6 is formed in the well W6. In this case, the conductivity type of the well W6 and the doped region P6 are P-type. The impurity concentration of the doped region P6 is higher than the impurity concentration of the well W6. The impurity concentration of the well W6 is similar to the impurity concentration of the well W1. The impurity concentration of the doped region P6 is similar to the impurity concentration of the doped region P1.

The types of wells W1~W6 are not limited in the present disclosure. When the impurity concentrations of the wells W1~W6 are low (e.g., lower than a threshold value), the wells W1~W6 are served as high-voltage wells. At this time, the operation voltage VH of the ESD protection structure 400A can arrive a first value. When the impurity concentrations of the wells W1~W6 are high (e.g., higher than the threshold value), the wells W1~W6 are served as low-voltage wells. At this time, the operation voltage VH of the ESD protection structure 400A can arrive a second value. In this case, the first value is higher than the second value. In other embodiments, the type of one of the wells W1~W6 is different from the type of another of the wells W1~W6. For example, at least one of the wells W1~W6 is a low-voltage well, and the others are high-voltage wells. In this case, the maximum value of the operation voltage VH may be within the first and second values.

In some embodiments, the ESD protection structure 400A further comprises wells W7~W12. The well W7 is formed in the well W1. The conductivity type of the well W7 is P-type. The impurity concentration of the well W7 is higher than the impurity concentration of the well W1 and lower than the impurity concentration of the doped region P1. The well W8 is formed in the well W2. The conductivity type of the well W8 is N-type. The impurity concentration of the well W8 is higher than the impurity concentration of the well W2 and lower than the impurity concentration of the doped region N1. The well W9 is formed in the well W3. The conductivity type of the well W9 is P-type. The impurity concentration of the well W9 is higher than the impurity concentration of the well W3 and lower than the impurity concentration of the doped region P3. The well W10 is formed in the well W4. The conductivity type of the well W10 is P-type. The impurity concentration of the well W10 is higher than the impurity concentration of the well W4 and lower than the impurity concentration of the doped region P4. The well W11 is formed in the well W5. The conductivity type of the well W11 is N-type. The impurity concentration of the well W11 is higher than the impurity concentration of the well W5 and lower than the impurity concentration of the doped region N1. The well W12 is formed in the well W6. The conductivity type of the well W12 is P-type. The impurity concentration of the well W12 is higher than the impurity concentration of the well W6 and lower than the impurity concentration of the doped region P6.

The impurity concentrations of the wells W7, W9, W10, and W12 are similar, and the impurity concentrations of the wells W8 and W11 are similar. In one embodiment, the wells W7, W9, W10, and W12 are referred to as low-voltage P-type wells (LVPWs), and the wells W8 and W11 are referred to as low-voltage N-type wells (LVNWs). In this case, the wells W1, W3, W4, and W6 are referred to as high-voltage P-type wells (HVPWs), and the wells W2 and W5 are referred to as high-voltage N-type wells (HVNWs).

In some embodiments, when the wells W7~W12 are formed in the wells W1~W6, respectively, the maximum value of the operation voltage of the ESD protection structure 400A may arrive a third value. In this case, the third value is higher than the first value. For example, the third value may be 20V.

In this embodiment, the doped region P1, the wells W1 and W7 form the emitter of the PNP BJT PNP_2. The deep N-type well 310, the wells W5 and W11, and the doped region N1 form the base of the PNP BJT PNP_2. The P-type substrate 300, the wells W6 and W12, and the doped region P6 form the collector of the PNP BJT PNP_2.

Additionally, the deep N-type well 310, the wells W5 and W11, and the doped region N1 form the cathode of the diode DD. The P-type substrate 300, the wells W6 and W12, and the doped region P6 form the anode of the diode DD.

The doped region P1, and the wells W7 and W1 form the collector of the PNP BJT PNP_1. The deep N-type well 310, and the wells W2 and W8 form the base of the PNP BJT PNP_1. The doped region P2 is provided as the emitter of the PNP BJT PNP_1. The equivalent resistor of the deep N-type well 310 serves as the resistor R_1.

The doped region P2 is served as the emitter of the PNP BJT PNP_4. The wells W8 and W2, and the deep N-type well 310 form the base of the PNP BJT PNP_4. The wells W3 and W9, and the doped region P3 form the collector of the PNP BJT PNP_4.

The doped region P5 is served as the emitter of the PNP BJT PNP_3. The wells W11 and W15, and the deep N-type well 310 form the base of the PNP BJT PNP_3. The wells W4 and W10, and the doped region P4 form the collector of the PNP BJT PNP_4. The equivalent resistors of the deep N-type well 310, and the wells W5 and W11 are served as the resistor R_2.

In some embodiments, the ESD protection structure 400A further comprises a resist protective oxide (RPO) 320. The RPO 320 is disposed in the surfaces of the doped regions P3 and P4 to cut-off the conductive layer on the surfaces of the doped regions P3 and P4. Furthermore, the ESD protection structure 400A further comprises isolation structures S_1~S_7. The isolation structures S_1~S_7 may be a field oxide layer or shallow trench isolations (STIs).

The doped region P1 is disposed between the isolation structures S_1 and S_2. The isolation structure S_2 isolates the doped region P1 form the doped region P2. In this embodiment, the isolation structure S_2 further isolates the well W7 from the well W8. The isolation structure S_3 isolates the doped region P2 from the doped region P3. In this embodiment, the isolation structure S_3 further isolates the well W8 from the well W9. The isolation structure S_4 isolates the doped region P4 from the doped region P5. In this embodiment, the isolation structure S_4 further isolates the well W10 from the well W11. The isolation structure S_5 isolates the doped region P5 from the doped region N1. In this embodiment, the isolation structure S_5 is disposed in the well W11. The isolation structure S_6 isolates the doped region N1 from the doped region P6. In this embodiment, the isolation structure S_6 further isolates the well W11 from the well W12. Additionally, the doped region P6 is disposed between the isolation structures S_6 and S_7.

In some embodiments, the width DS1 of the isolation structure S_5 is related to the effectiveness of the ESD protection structure 400A. For example, when the width DS1 of the isolation structure S_5 is larger, the ESD protection structure 400A has a better human-body model (HBM) performance and a better machine model (MM) performance. Additionally, the on-resistance of the ESD protection structure 400A is low so that the ESD current easily enters the ESD protection structure 400A.

In other embodiments, the ESD protection structure 400A further comprises interconnect structures 330~350. The interconnect structure 330 is electrically connected to the power pad PD_1, the doped regions N1, P5, and P2. The interconnect structure 340 is electrically connected to the power pad PD_2, the doped regions P1, P3, and P4. The interconnect structure 350 is electrically connected to the power pad PD_3 and the doped region P6. In this case, the power pad PD_1 receives the operation voltage VH, the power pad PD_2 receives the operation voltage VL, and the power pad PD_3 receives the operation voltage VSUB.

Refer to FIG. 3A, FIG. 3A shows the layout of the doped regions P1~P6 and N1 of the ESD protection structure 400A. For simplification, other elements in FIG. 4A are omitted and the not shown in FIG. 3A. Referring to FIG. 3A, the doped regions P6 and N1 take the form of a ring. The doped regions P1~P5 are surrounded by the doped region N1. The doped region N1 is surrounded by the doped region P6. The RPO 320 overlaps a portion of the doped region P1, a portion of the doped region P3, and a portion of the doped region P4.

Figure 3B:
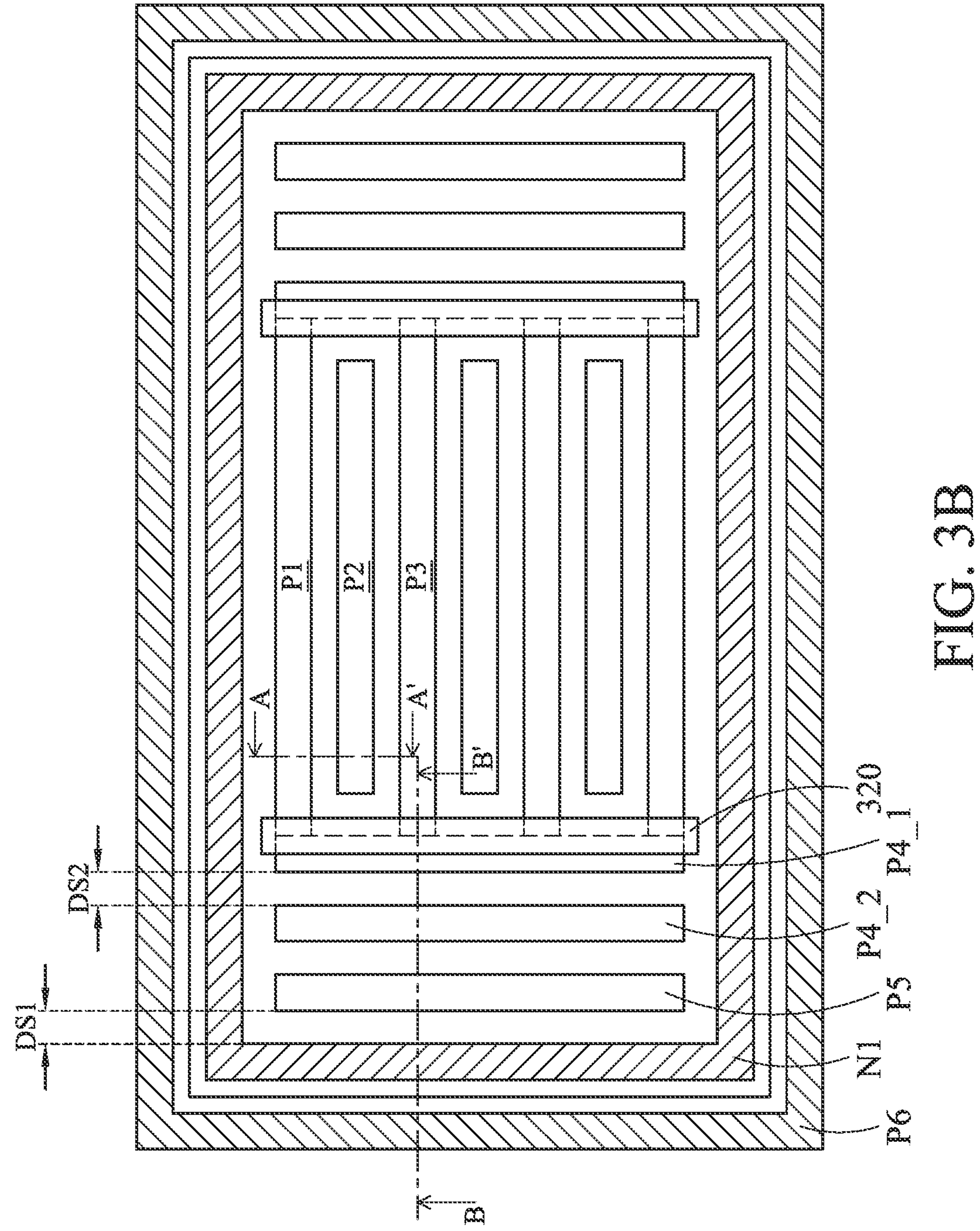
FIG. 3B is a top view of another exemplary embodiment of the ESD protection structure according to various aspects of the present disclosure.
Figure 4B:
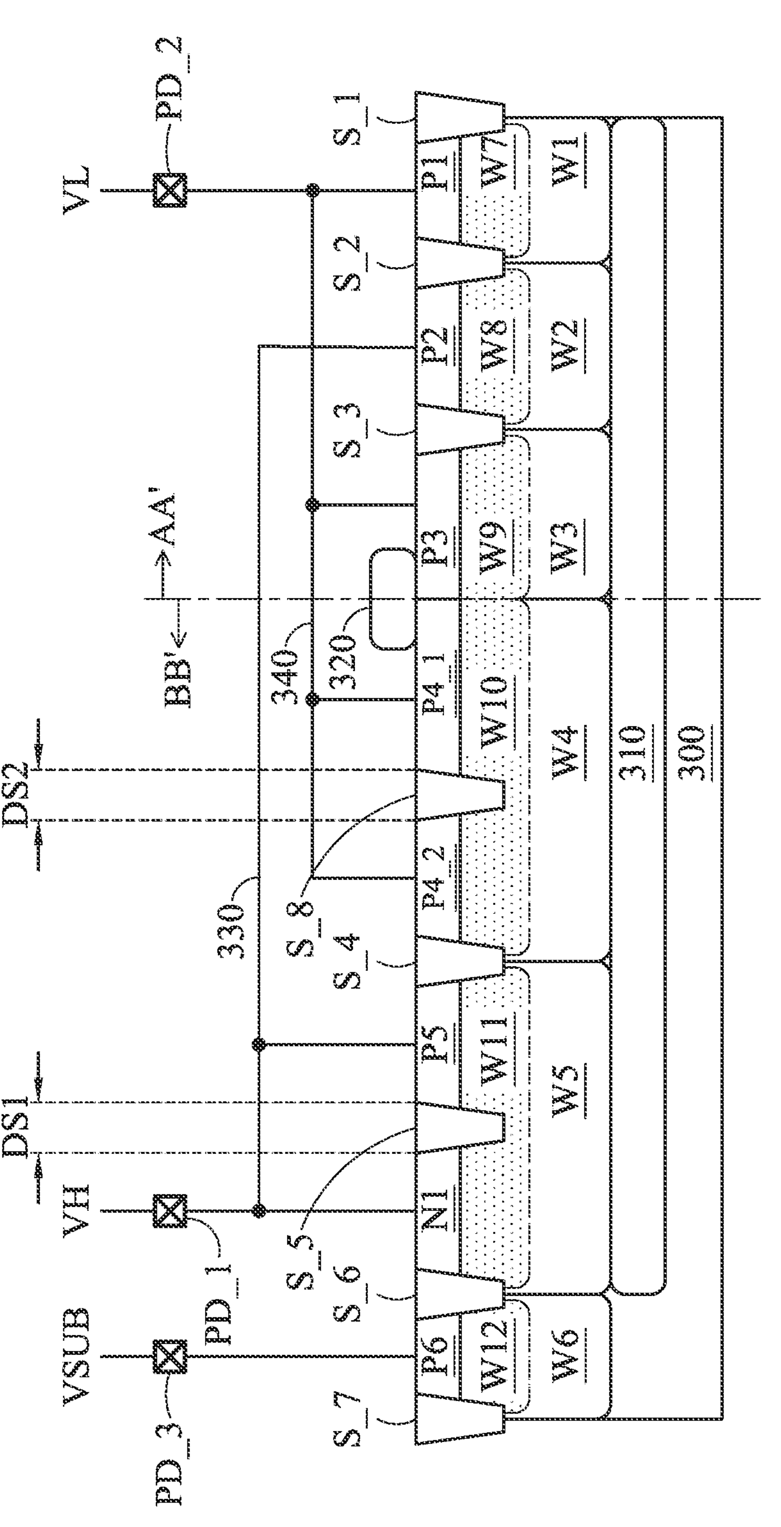
FIG. 4B is a cross-sectional view of the ESD protection structure along the dotted lines AA' and BB' in FIG. 3B.

FIG. 3B is a top view of another exemplary embodiment of the ESD protection structure according to various aspects of the present disclosure. FIG. 4B is a cross-sectional view of the ESD protection structure along the dotted lines AA' and BB' in FIG. 3B. FIG. 4B is similar to FIG. 4A except for the addition of isolation structure S_8 in the ESD protection structure 400B of FIG. 4B. For simplification, other elements in FIG. 4A are omitted and the not shown in FIG. 4B.

The isolation structure S_8 isolates the doped region P4 of FIG. 4A. The isolated doped regions are referred to as a doped region P4_1 and P4_2. In this case, the interconnect structure 340 is electrically connected to the power pad PD_2, the doped regions P1, P3, P4_1, and P4_2. In some embodiments, the width DS2 of the isolation structure S_8 is related to the effectiveness of the ESD protection structure 400B. For example, when the width DS2 of the isolation structure S_8 is larger, the ESD protection structure 400B has better HBM performance and MM performance. Additionally, the on-resistance of the ESD protection structure 400B is low so that the ESD current easily enters the ESD protection structure 400B.

Referring to FIG. 3B, FIG. 3B shows the layout of the doped regions P1~P3, P4_1, P4_2, P5, P6, and N1 of the ESD protection structure 400B. FIG. 3B is similar to FIG. 3A except for the addition of doped regions P4_1 and P4_2. For simplification, other elements in FIG. 4B are omitted and the not shown in FIG. 3B. Referring to FIG. 3B, the doped region P4_2 is disposed between the doped regions P5 and P4_1. The RPO 320 overlaps a portion of the doped regions P1, P3, and P4_1.

Figure 5A:
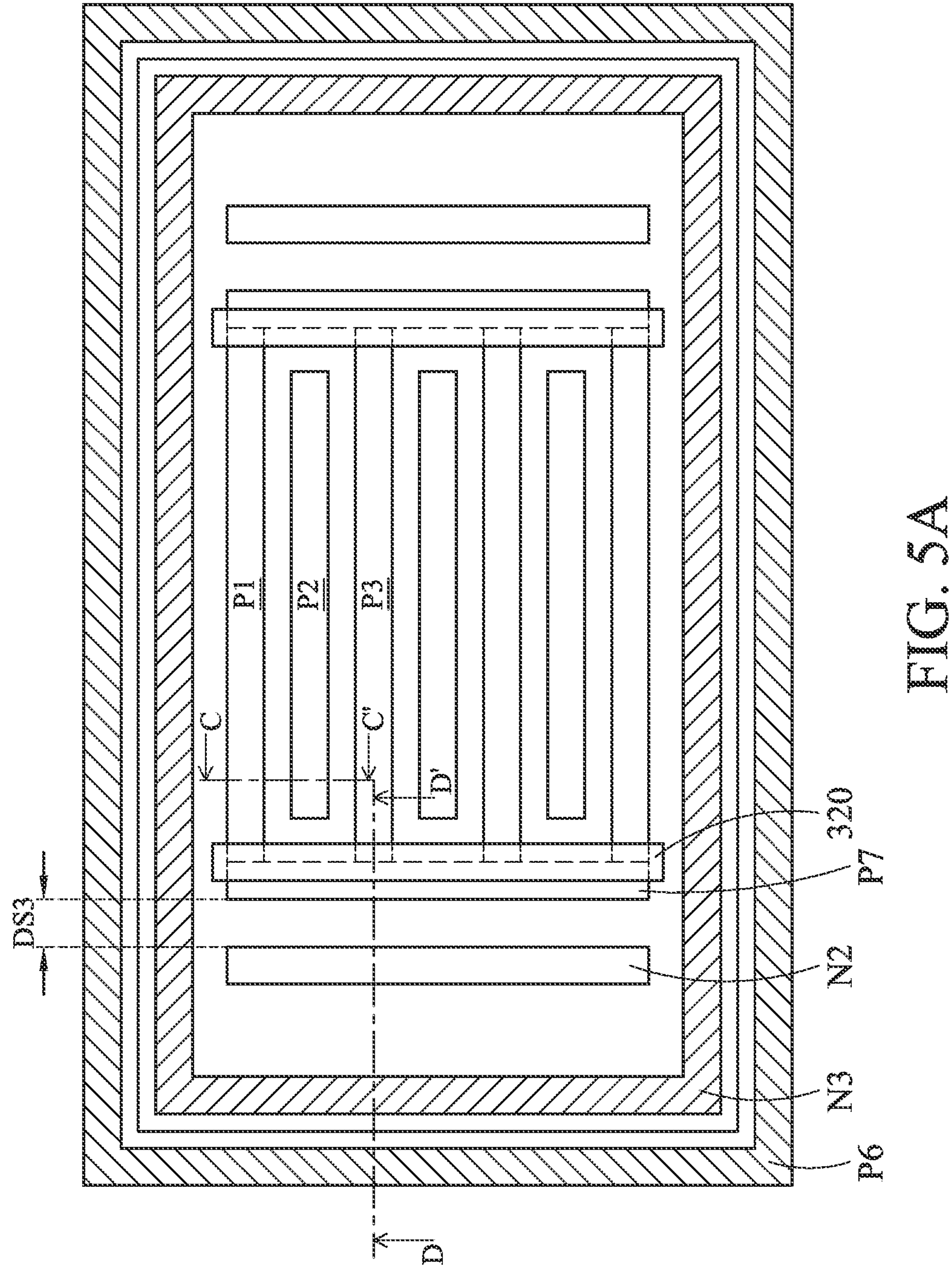
FIG. 5A is a top view of another exemplary embodiment of the ESD protection structure according to various aspects of the present disclosure.
Figure 6A:
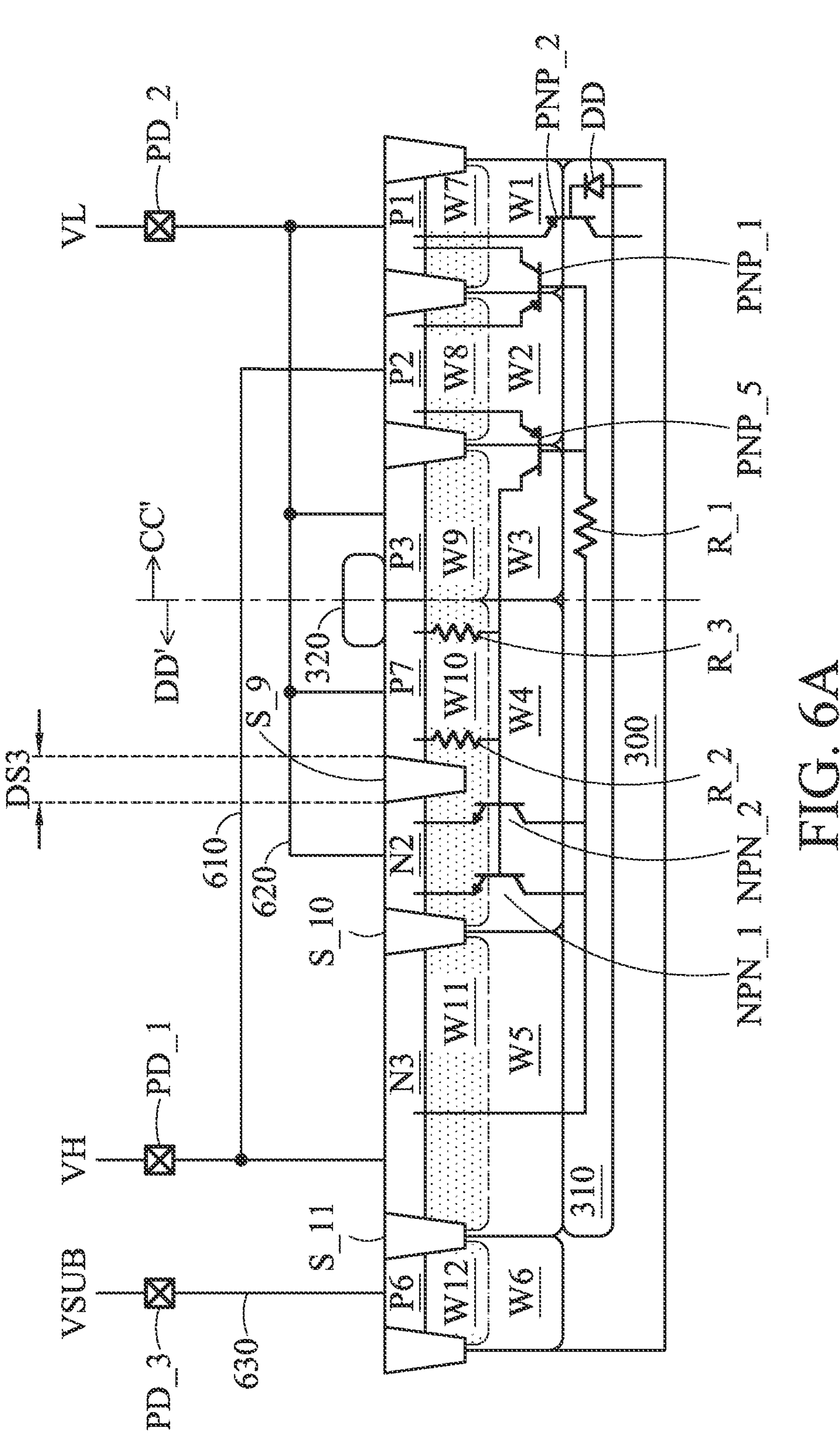
FIG. 6A is a cross-sectional view of the ESD protection structure along the dotted lines CC' and DD' in FIG. 5A.

FIG. 5A is a top view of another exemplary embodiment of the ESD protection structure of the ESD protection circuit 210 according to various aspects of the present disclosure. FIG. 6A is a cross-sectional view of the ESD protection structure along the dotted lines CC' and DD' in FIG. 5A. As shown in FIG. 6A, the ESD protection structure 600A comprises the P-type substrate 300, the deep N-type well 310, the wells W1~W12, the doped regions P1~P3, P6, P7, N2, and N3. Since the characteristics of the P-type substrate 300, the deep N-type well 310, the wells W1~W12, and the doped regions P1~P3 and P6 have been described above, the descriptions of the P-type substrate 300, the deep N-type well 310, the wells W1~W12, and the doped regions P1~P3 and P6 are omitted. For simplification, FIG. 6A omits some symbols that appear in FIG. 4A.

As shown in FIG. 6A, the doped regions P7 and N2 are formed in the well W10. The conductivity type of the doped region P7 is P-type. The conductivity type of the doped region N2 is N-type. Furthermore, the doped region N3 is formed in the well W11. The conductivity type of the doped region N3 is N-type. In this embodiment, the impurity concentrations of the doped regions N2 and N3 are similar and higher than the impurity concentrations of the wells W5 and W11.

The isolation structure S_9 isolates the doped region P7 from the doped region N2. The isolation structure S_9 is disposed in the well W10. In this embodiment, the width DS3 of the isolation structure S_9 is adjusted to improve the effectiveness of the ESD protection structure 600A, such as to increase the HBM performance and the MM performance. Additionally, the on-resistance of the ESD protection structure 600A is low.

In some embodiments, the isolation structure S_10 isolates the doped region N2 from the doped region N3. In one embodiment, the isolation structure S_10 may isolate the well W10 from the well W11. The isolation structure S_11 isolates the doped region N3 from the doped region P6. In other embodiments, the isolation structure S_11 further isolates the well W11 from the well W12.

In this embodiment, the doped region P, and the wells W7 and W1 form the emitter of the PNP BJT PNP_2. The deep N-type well 310, the wells W5 and W11, and the doped region N3 form the base of the PNP BJT PNP_2. The P-type substrate 300, the wells W6 and W12, and the doped region P6 form the collector of the PNP BJT PNP_2. Additionally, the deep N-type well 310, the wells W5 and W11, and the doped region N3 form the cathode of the diode DD. The P-type substrate 300, the wells W6 and W12, and the doped region P6 form the anode of the diode DD.

The doped region P1, and the wells W7 and W1 form the collector of the PNP BJT PNP_1. The doped region P2 is served as the emitter of the PNP BJT PNP_1. The deep N-type well 310, and the wells W2 and W8 form the base of the PNP BJT PNP_1. The equivalent resistance of the deep N-type well 310 serves as the resistor R_1.

The doped region P2 is served as the emitter of the parasitic PNP BJT pnp_5. The wells W8 and W2, and the deep N-type well 310 form the base of the parasitic PNP BJT PNP_5. The wells W3 and W9, and the doped region P3 form the collector of the parasitic PNP BJT PNP_5.

The doped region N2 serves as the emitter of the parasitic NPN BJT NPN_2. The wells W10 and W4 form the base of the parasitic NPN BJT NPN_2. The deep N-type well 310, the wells W5 and W11, and the doped region N3 form the collector of the parasitic NPN BJT NPN_2.

The doped region N2 serves as the emitter of the NPN BJT NPN_1. The wells W10 and W4 form the base of the NPN BJT NPN_1. The deep N-type well 310, the wells W5 and W11, and the doped region N3 form the collector of the NPN BJT NPN_1. The equivalent resistance of the well W10 serves as the resistors R_2 and R_3.

In this embodiment, the interconnect structure 610 is electrically connected to the power pad PD_1, and the doped regions N3 and P2. The interconnect structure 620 is electrically connected to the power pad PD_2, the doped regions P1, P3, P7, and N2. The interconnect structure 630 is electrically connected to the power pad PD_3 and the doped region P6. In this case, the power pad PD_1 receives the operation voltage VH, the power pad PD_2 receives the operation voltage VL, and the power pad PD_3 receives the operation voltage VSUB.

Referring to FIG. 5A, FIG. 5A shows the layout of the doped regions P1~P3, P6, P7, N2, and N3 of the ESD protection structure 600A. For simplification, other elements in FIG. 6A are omitted and the not shown in FIG. 5A. Referring to FIG. 5A, the doped regions P6 and N3 are generally ring-shaped. The doped regions P1~P3, P6, and P7 are surrounded by the doped region N3. The doped region N3 is surrounded by the doped region P6. The RPO 320 overlaps a portion of the doped region P1, a portion of the doped region P3, and a portion of the doped region P7.

In some embodiments, the distance DS3 (i.e., the width of the isolation structure S_9) between the doped regions N2 and P7 is related to the effectiveness of the ESD protection structure 600A. For example, when the distance DS3 is larger, the ESD protection structure 600A has a better HBM performance and a better MM performance. Additionally, the on-resistance of the ESD protection structure 600A is low.

Figure 5B:
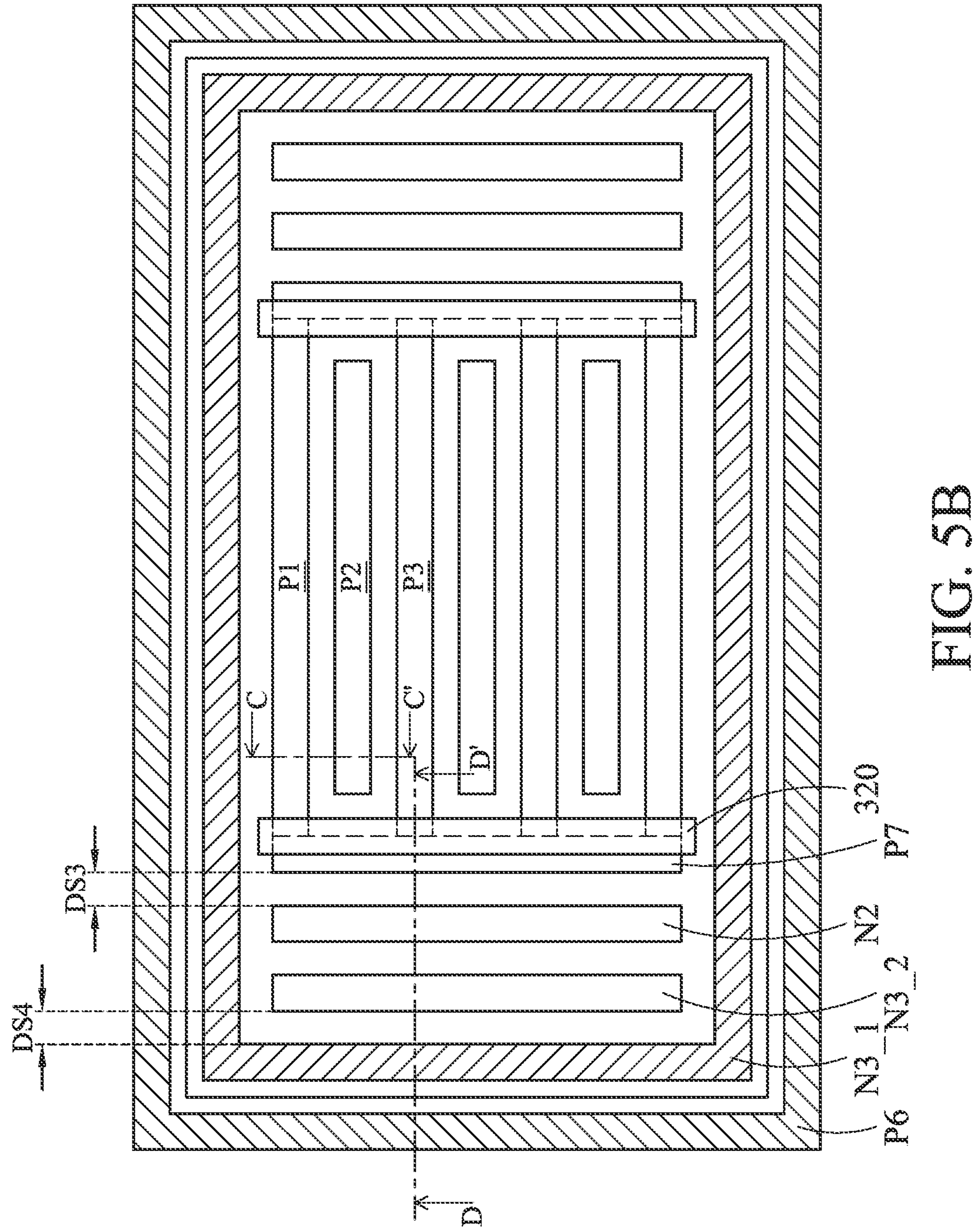
FIG. 5B is a top view of another exemplary embodiment of the ESD protection structure according to various aspects of the present disclosure.
Figure 6B:
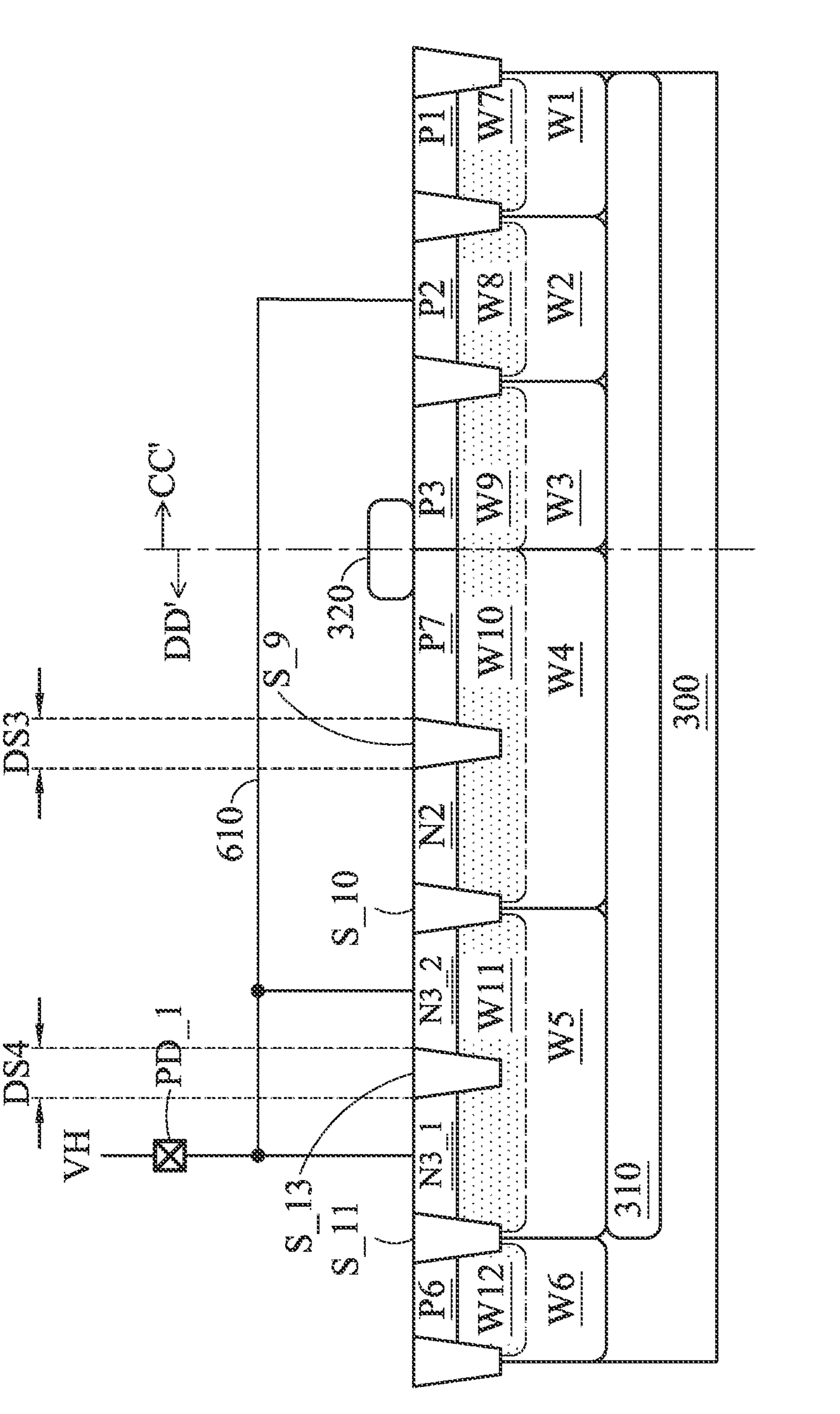
FIG. 6B is a cross-sectional view of the ESD protection structure along the dotted lines CC' and DD' in FIG. 5B.

FIG. 5B is a top view of another exemplary embodiment of the structure of the ESD protection circuit 210 according to various aspects of the present disclosure. FIG. 6B is a cross-sectional view of the ESD protection structure 600B along the dotted lines CC' and DD' in FIG. 5B. FIG. 6B is similar to FIG. 6A with the exception that the ESD protection structure 600B further comprises an isolation structure S_13. For simplification, FIG. 6B omits some symbols that appear in FIG. 6A.

The isolation structure S_13 isolates the doped region N3 shown in FIG. 6A to form the doped regions N3_1 and N3_2. As shown in FIG. 6B, the doped regions N3_1 and N3_2 are disposed in the well W11. The conductivity types of the doped regions N3_1 and N3_2 are N-type. The impurity concentrations of the doped regions N3_1 and N3_2 are higher than the impurity concentration of the well W11. The impurity concentration of the well W11 is higher than the impurity concentration of the well W5. The doped region N3_1 is disposed between the isolation structures S_11 and S_13. The doped region N3_2 is disposed between the isolation structures S_10 and S_13. In this embodiment, the interconnect structure 610 is electrically connected to the power pad PD_1, the doped regions N3_1, N3_2, and P2.

Referring to FIG. 5B, FIG. 5B shows the layout of the doped regions P1~P3, P6, P7, N2, N3_1, and N3_2 of the ESD protection structure 600B. FIG. 5B is similar to FIG. 5A except for the addition of doped regions N3_1 and N3_2 in FIG. 5B. For simplification, other elements in FIG. 6B are omitted and the not shown in FIG. 5B. Referring to FIG. 5B, the doped region N3_2 is disposed between the doped regions N3_1 and N2. The doped region N3_1 is disposed between the doped regions N3_2 and P6.

In some embodiments, the distance DS3 (i.e., the width of the isolation structure S_9 in FIG. 6B) between the doped regions N2 and P7, and the distance DS4 (i.e., the width of the isolation structure S_13 in FIG. 6B) between the doped regions N3_1 and N3_2 are related to the effectiveness of the ESD protection structure 600B. For example, when at least one of the distances DS3 and DS4 is larger, the ESD protection structure 600B has a better HBM performance and a better MM performance. Additionally, the on-resistance of the ESD protection structure 600B is low.

Figure 7A:
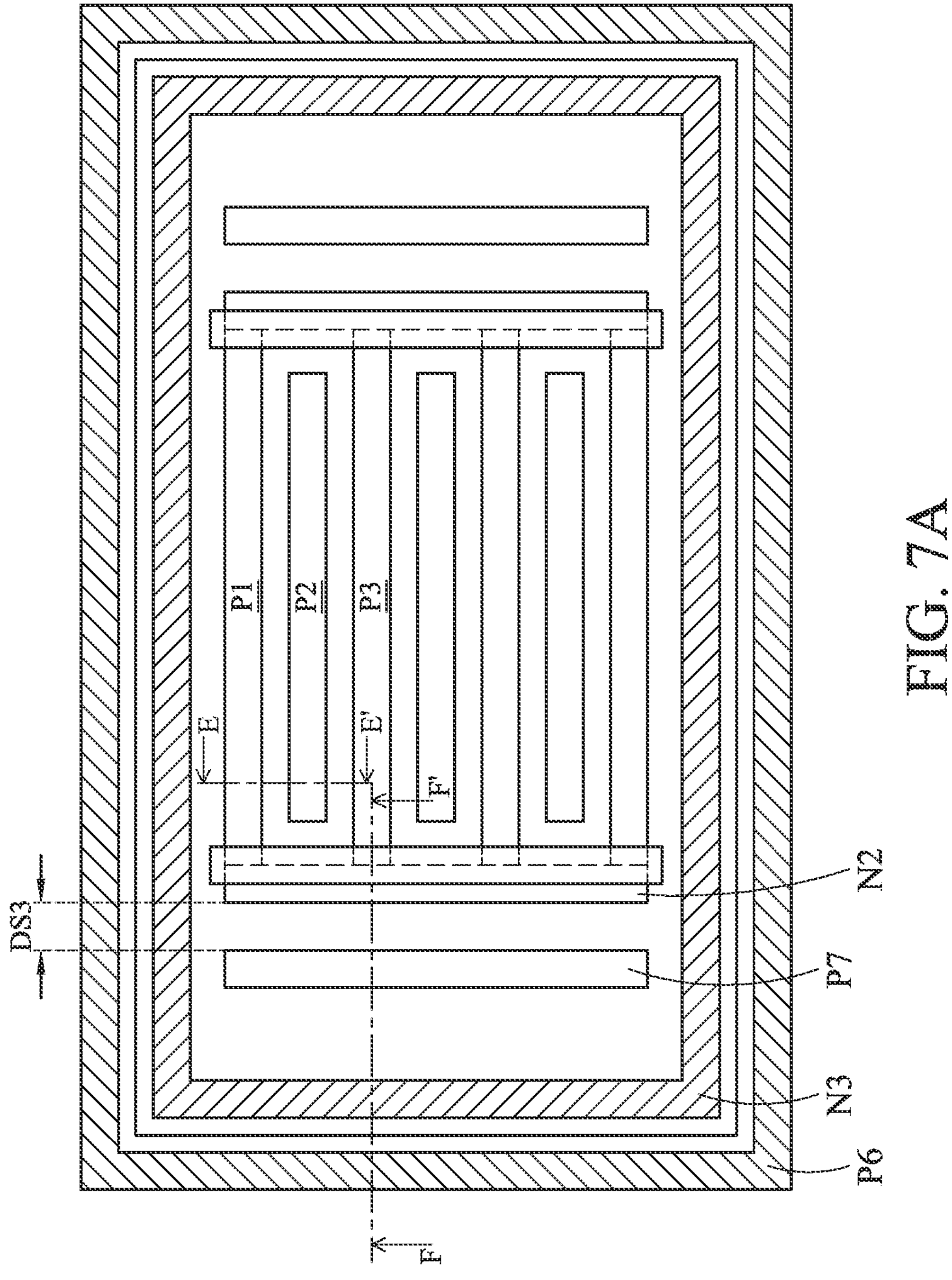
FIG. 7A is a top view of another exemplary embodiment of the ESD protection structure according to various aspects of the present disclosure.
Figure 8A:
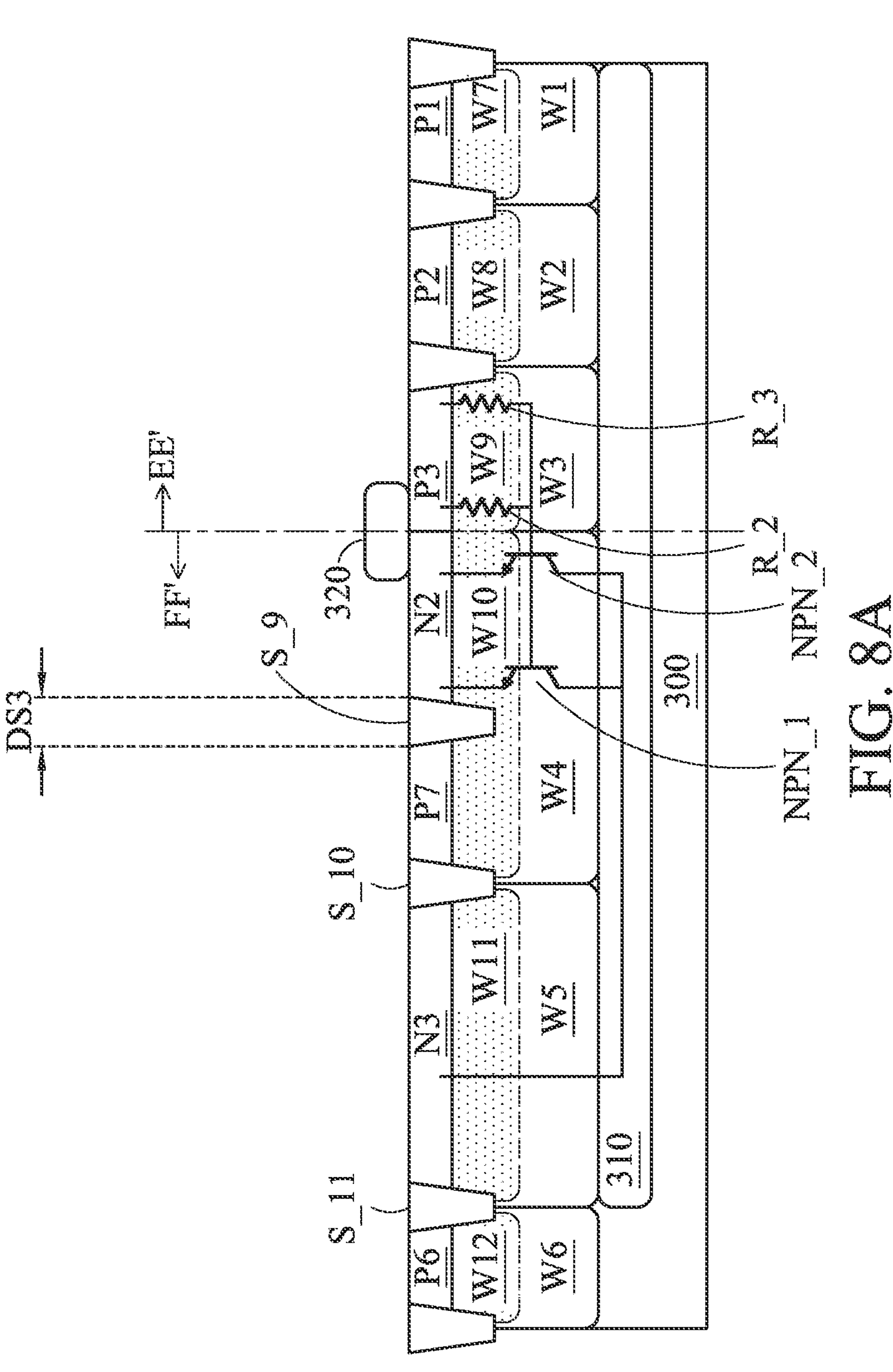
FIG. 8A is a cross-sectional view of the ESD protection structure along the dotted lines EE' and FF' in FIG. 7A.

FIG. 7A is a top view of another exemplary embodiment of the structure of the ESD protection circuit 210 according to various aspects of the present disclosure. FIG. 8A is a cross-sectional view of the ESD protection structure along the dotted lines EE' and FF' in FIG. 7A. FIG. 8A is similar to FIG. 6A with the exception that the positions of the doped regions P7 and N2 in FIG. 8A are different from the positions of the doped regions P7 and N2 in FIG. 6A. For simplification, other elements in FIG. 6A are omitted and the not shown in FIG. 8A.

In FIG. 6A, the doped region N2 is disposed between the isolation structures S_9 and S_10. Therefore, the distance between the doped regions N2 and N3 is less than the distance between the doped regions P7 and N3 in FIG. 6A. In FIG. 8A, the doped region P7 is disposed between the isolation structures S_9 and S_10. Therefore, the distance between the doped regions P7 and N3 is less than the distance between the doped regions N2 and N3 in FIG. 8A. In this embodiment, the equivalent resistor of the doped regions P3 and W9 serves as the resistors R_2 and R_3 shown in FIG. 2.

Referring to FIG. 7A, FIG. 7A shows the layout of the doped regions P1~P3, P6, P7, N2, and N3 of the ESD protection structure 800A. For simplification, other elements in FIG. 8A are omitted and the not shown in FIG. 7A. Referring to FIG. 7A, the doped region P7 is disposed between the doped regions N2 and N3.

In some embodiments, the distance DS3 (i.e., the width of the isolation structure S_9 in FIG. 8A) between the doped regions N2 and P7 is related to the effectiveness of the ESD protection structure 800A. For example, when the distance DS3 is larger, the ESD protection structure 800A has a better HBM performance and a better MM performance. Additionally, the on-resistance of the ESD protection structure 800A is low.

Figure 7B:
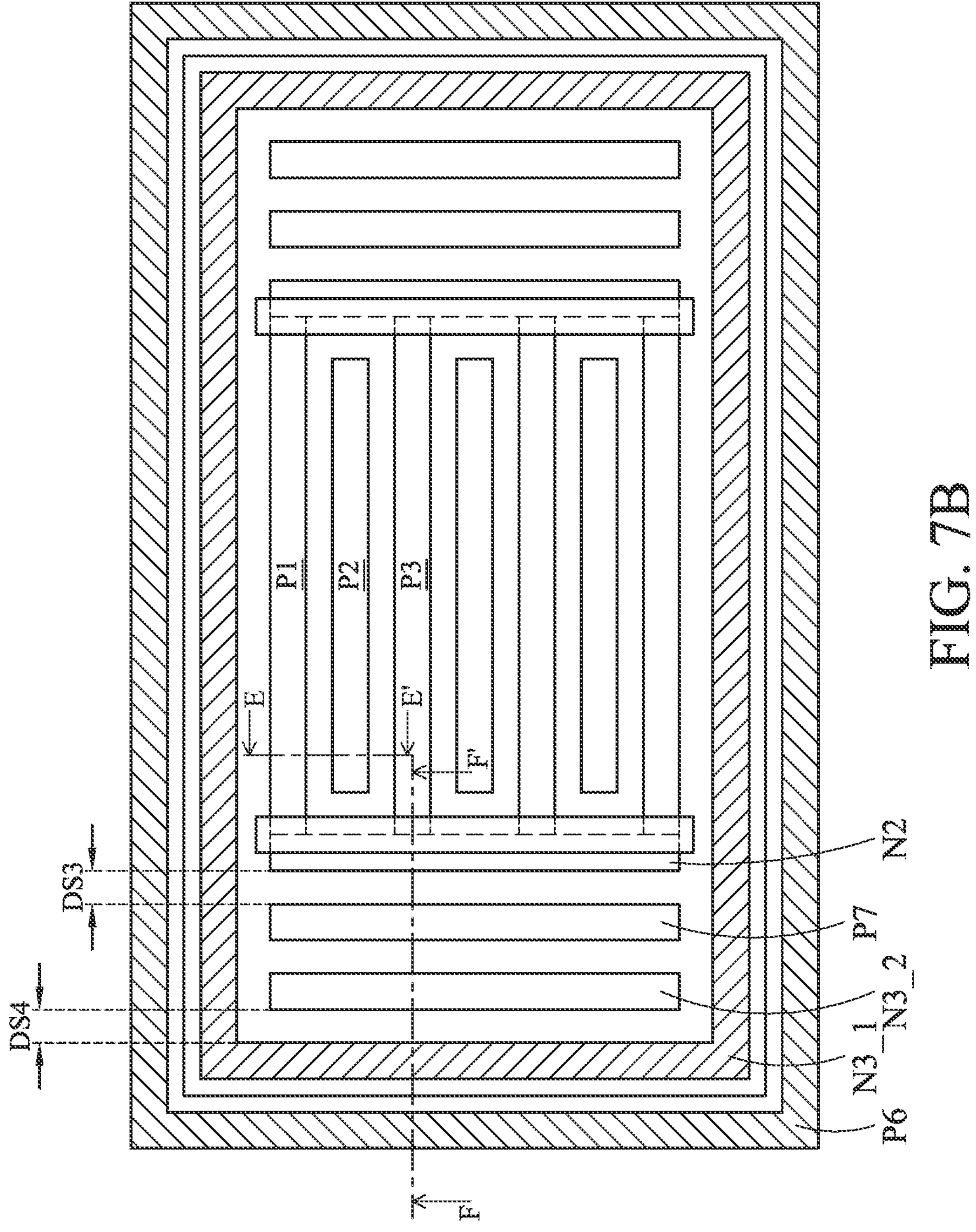
FIG. 7B is a top view of another exemplary embodiment of the ESD protection structure according to various aspects of the present disclosure.
Figure 8B:
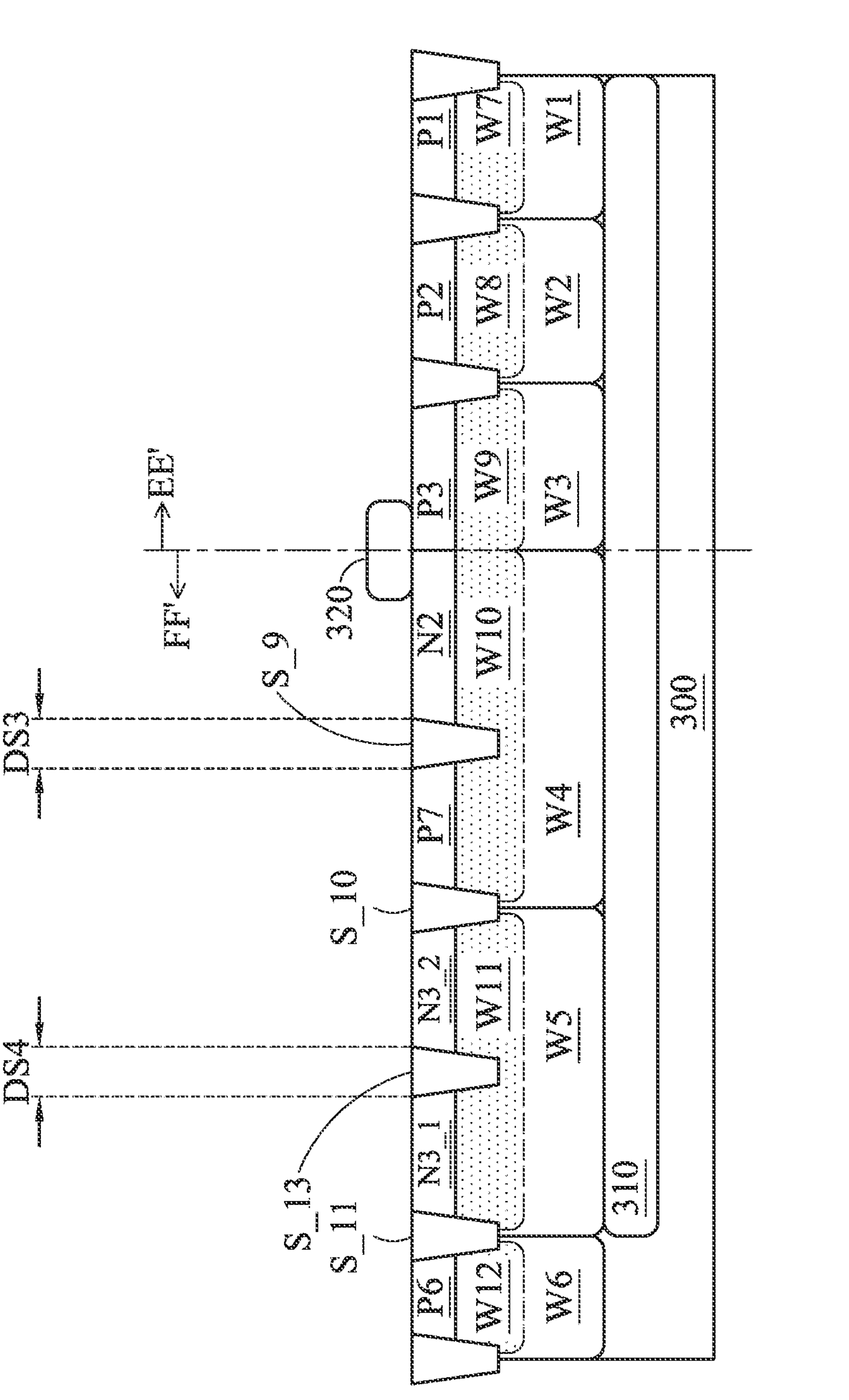
FIG. 8B is a cross-sectional view of the ESD protection structure along the dotted lines EE' and FF' in FIG. 7B.

FIG. 7B is a top view of another exemplary embodiment of the structure of the ESD protection circuit 210 according to various aspects of the present disclosure. FIG. 8B is a cross-sectional view of the ESD protection structure 800B along the dotted lines EE' and FF' in FIG. 7B. FIG. 8B is similar to FIG. 6B with the exception that the positions of the doped regions P7 and N2 in FIG. 8B are different from the positions of the doped regions P7 and N2 in FIG. 68. For simplification, other elements in FIGS. 6B and 8A are omitted and the not shown in FIG. 8B.

In FIG. 6B, the doped region N2 is disposed between the isolation structures S_9 and S_10. Therefore, the distance between the doped regions N2 and N3_2 is less than the distance between the doped regions P7 and N3_2 in FIG. 6B. In FIG. 8B, the doped region P7 is disposed between the isolation structures S_9 and S_10. Therefore, the distance between the doped regions P7 and N3_2 is less than the distance between the doped regions N2 and N3_2.

Referring to FIG. 7B, FIG. 7A shows the layout of the doped regions P1~P3, P6, P7, N2, N3_1, and N3_2 of the ESD protection structure 800B. FIG. 7B is similar to FIG. 7A except for the addition of the doped regions N3_1 and N3_2. For simplification, other elements in FIG. 8B are omitted and the not shown in FIG. 7B. Referring to FIG. 7B, the doped region P7 is disposed between the doped regions N3_2 and N2. The doped region N3_1 takes the form of a ring. The doped regions P1~P3, P7, N2, and N3_2 are surrounded by the doped region N3_1.

In some embodiments, the distance DS3 (i.e., the width of the isolation structure S_9 in FIG. 8B) between the doped regions N2 and P7, and the distance DS4 (i.e., the width of the isolation structure S_13 in FIG. 8B) between the doped regions N3_1 and N3_2 are related to the effectiveness of the ESD protection structure 800B. For example, when at least one of the distances DS3 and DS4 is larger, the ESD protection structure 800B has a better HBM performance and a better MM performance. Additionally, the on-resistance of the ESD protection structure 800B is low.

It will be understood that when an element is referred to as being "on", "connected to" or "coupled to" another element, it can be directly on, connected or coupled to the other element or intervening elements may be present. In contrast, when an element is referred to as be "directly on", "directly connected to" or "directly coupled to" another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will be understood that although the terms "first," "second," etc. may be used herein to describe various elements, these elements should not be limited by these terms. These terms are only used to distinguish one element from another. In the following claims, the terms "first," "second," etc. are used merely as labels, and are not intended to impose numerical requirements on their objects.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection circuit for protecting a core circuit, comprising:

a first PNP bipolar junction transistor (BJT) comprising a first base, a first emitter, and a first collector, wherein the first emitter is coupled to a first power pad, and the first collector is coupled to a second power pad;

a first resistor coupled between the first power pad and the first base;

a second PNP BJT comprising a second base, a second emitter, and a second collector, wherein the second emitter is coupled to the second power pad, and the second collector is coupled to a third power pad;

a diode comprising a cathode and an anode, wherein the cathode is coupled to the first power pad and the second base, and the anode is coupled to the third power pad;

a specific BJT coupled between the first and second power pads; and a second resistor coupled between an emitter and a base of the specific BJT, wherein in response to an ESD event occurring, the first PNP BJT and the specific BJT are turned on so that an ESD current passes through the first PNP BJT and the specific BJT.

2. The ESD protection circuit as claimed in claim 1, wherein:

the specific BJT is a third PNP BJT, an emitter of the third PNP BJT is coupled to the first power pad, a collector of the third PNP BJT is coupled to the second power pad, and a base of the third PNP BJT is coupled to the second resistor.

3. The ESD protection circuit as claimed in claim 2, further comprising:

a parasitic PNP BJT, wherein a base of the parasitic PNP BJT is coupled to the first base, an emitter of the parasitic PNP BJT is coupled to the first power pad, and a collector of the parasitic PNP BJT is coupled to the second power pad.

4. The ESD protection circuit as claimed in claim 3, wherein the first PNP BJT, the specific BJT, and the parasitic PNP BJT share the same substrate.

5. The ESD protection circuit as claimed in claim 3, wherein the parasitic PNP BJT is turned on in response to the ESD event occurring.

6. The ESD protection circuit as claimed in claim 1, wherein:

the specific BJT is a first NPN BJT, a base of the first NPN BJT is coupled to the second resistor, an emitter of the first NPN BJT is coupled to the second power pad, and a collector of the first NPN BJT is coupled to the first power pad.

7. The ESD protection circuit as claimed in claim 6, further comprising:

a parasitic PNP BJT having a base coupled to the first base, having an emitter coupled to the first power pad, and having a collector coupled to the base of the first NPN BJT;

a third resistor coupled between the collector of the parasitic PNP BJT and the second power pad;

a second NPN BJT having a base coupled to the base of the first NPN BJT, having an emitter coupled to the second power pad, and having a collector coupled to the first base.

8. The ESD protection circuit as claimed in claim 7, wherein the first PNP BJT, the specific BJT, the parasitic PNP BJT, and the second NPN BJT share the same substrate.

9. The ESD protection circuit as claimed in claim 1, wherein:

in response to there being no ESD event, the first power pad receives a first operation voltage, the second power pad receives a second operation voltage, and the third power pad receives a third operation voltage, the first operation voltage is higher than the second operation voltage, and the second operation voltage is higher than the third operation voltage.

10. The ESD protection circuit as claimed in claim 9, wherein in response to there being no ESD event:

the first PNP BJT and the specific BJT are turned off, the first power pad provides the first operation voltage to the core circuit, the second power pad provides the second operation voltage to the core circuit, and the third power pad provides the third operation voltage to the core circuit.

11. An ESD protection structure comprising:

a P-type substrate;

a deep N-type well formed in the P-type substrate;

a first well formed on the deep N-type well;

a first P-type doped region formed in the first well;

a second well formed on the deep N-type well;

a second P-type doped region formed in the second well;

a third well formed on the deep N-type well;

a third P-type doped region formed in the third well;

a fourth well formed on the deep N-type well;

a fourth P-type doped region formed in the fourth well;

a fifth well formed on the deep N-type well;

a specific doped region formed in the fourth or fifth well; and a first N-type doped region formed in the fifth well, wherein:

conductivity types of the first, third, and fourth wells are P-type, and conductivity types of the second and fifth wells are N-type.

12. The ESD protection structure as claimed in claim 11, wherein the conductivity type of the specific doped region is P-type, and the specific doped region is formed in the fifth well.

13. The ESD protection structure as claimed in claim 12, further comprising:

a first isolation structure formed in the fifth well and isolating the specific doped region from the first N-type doped region.

14. The ESD protection structure as claimed in claim 12, further comprising:

a fifth P-type doped region formed in the fourth well; and a second isolation structure formed in the fourth well and isolating the fourth P-type doped region from the fifth P-type doped region.

15. The ESD protection structure as claimed in claim 11, wherein the conductivity type of the specific doped region is N-type, and the specific doped region is formed in the fourth well.

16. The ESD protection structure as claimed in claim 15, further comprising:

a third isolation structure formed in the fourth well and isolating the specific doped region from the fourth P-type doped region.

17. The ESD protection structure as claimed in claim 15, further comprising:

a second N-type doped region formed in the fifth well; and a second isolation structure formed in the fifth well and isolating the first N-type doped region from the second N-type doped region.

18. The ESD protection structure as claimed in claim 17, wherein the specific doped region is formed between the second N-type doped region and the fourth P-type doped region.

19. The ESD protection structure as claimed in claim 17, wherein the fourth P-type doped region is formed between the specific doped region and the first N-type doped region.

20. The ESD protection structure as claimed in claim 11, further comprising:

a first interconnect structure electrically connected to the first N-type doped region, the specific doped region, and the second P-type doped region; and a second interconnect structure electrically connected to the first, third, and fourth P-type doped regions.

* * * * *